(12) United States Patent  
Dutton et al.

(10) Patent No.: US 9,171,985 B2  
(45) Date of Patent: Oct. 27, 2015

(54) PIXEL CIRCUIT WITH CONTROLLED CAPACITOR DISCHARGE TIME OF FLIGHT MEASUREMENT

(71) Applicants: STMicroelectronics (Research & Development) Limited, Marlow, Buckinghamshire (GB); The University Court of the University of Edinburgh, Edinburgh (GB)

(72) Inventors: Neale Dutton, Edinburgh (GB); Robert K. Henderson, Edinburgh (GB)

(73) Assignee: STMicroelectronics (Research & Development) Limited, Marlow, Buckinghamshire (GB)

( * ) Notice: Subject to any disclaimer, the term of this patent is extended or adjusted under 35 U.S.C. 154(b) by 262 days.

(21) Appl. No.: 14/066,771

(22) Filed: Oct. 30, 2013

(65) Prior Publication Data

US 2014/0124652 A1    May 8, 2014

(30) Foreign Application Priority Data

Nov. 2, 2012   (GB) .................................. 1219782.8

(51) Int. Cl.
*H01L 31/107* (2006.01)
*H01L 27/146* (2006.01)
(Continued)

(52) U.S. Cl.
CPC ............ *H01L 31/107* (2013.01); *G01S 7/4863* (2013.01); *G01S 7/4865* (2013.01); *G01S 17/10* (2013.01); *G01S 17/89* (2013.01); *H01L 27/14601* (2013.01); *G01J 2001/442* (2013.01); *H04N 5/37452* (2013.01)

(58) Field of Classification Search
CPC .... G01J 2001/442; G01S 17/10; G01S 17/89; G01S 7/4863; G01S 7/4865; H01L 27/14601; H01L 31/107; H04N 5/37452
See application file for complete search history.

(56) References Cited

U.S. PATENT DOCUMENTS

2003/0042406 A1    3/2003   Charbon
2011/0194099 A1*   8/2011   Kamiyama ............. G01C 3/08
                                                      356/5.03
(Continued)

FOREIGN PATENT DOCUMENTS

EP    2187237 A1    5/2010
GB    2487958 A     8/2012
JP    2005291985 A  10/2005

OTHER PUBLICATIONS

EPO Search Report and Written Opinion for EP13275258 mailed Feb. 28, 2014 (8 pages).

(Continued)

*Primary Examiner* — Francis M Legasse, Jr.
(74) *Attorney, Agent, or Firm* — Gardere Wynne Sewell LLP

(57) ABSTRACT

A pixel circuit includes a single photon avalanche diode (SPAD) and a measurement circuit including a capacitance. The SPAD detects an incident photon and the measurement circuit discharges the capacitance at a known rate during a discharge time period. The length of the discharge time period is determined by the time of detection of the photon, such that the final amount of charge on the capacitance corresponds to the time of flight of the photon. The pixel circuit may be included in a time resolved imaging apparatus. A method of measuring the time of flight of a photon includes responding to an incident photon detection by discharging a capacitance at a known rate and correlating final capacitance charge to time of flight.

23 Claims, 5 Drawing Sheets

(51) Int. Cl.
*G01S 17/10* (2006.01)
*G01S 17/89* (2006.01)
*G01S 7/486* (2006.01)
*G01J 1/44* (2006.01)
*H04N 5/3745* (2011.01)

(56) References Cited

U.S. PATENT DOCUMENTS

2011/0304758 A1 12/2011 Eldesouki et al.
2012/0261553 A1* 10/2012 Elkind ............... H04N 5/335
250/208.1

OTHER PUBLICATIONS

Stoppa D, et al; "A single-photon-avalanche-diode 3d imager", Solid-State Circuits Conference, 2005. ESSCIRC 2005, Proceedings of the 31st European, IEEE, Piscataway, NJ, USA. Sep. 12, 2005, pp. 487-490 (ISDN: 978-0-7803-9205-2).

Stoppa D, et al; "A CMOS Sensor based on Single Photon Avalanche Diode for Distance Measurement Applications". Instrumentation and Measurement Technology Conference, 2005, IMTC 2005, Proceedings of the IEEE Ottawa, ON, Canada May 16-19, 2005, Piscataway, NJ, USA; vol. 2, May 16, 2005, pp. 1162-1165 (ISBN: 978-0-7803-8879-6).

Stoppa D, et al; "A CMOS 3-D Imager Based on Single Photon Avalanche Diode", IEEE Transactions on Circuits and Systems Part I: Regular Papers, IEEE Service Center, New York, NY, US, vol. 54, No. 1, Jan. 1, 2007, pp. 4-12 (ISSN: 1057-7122).

Durini D, et al; "Time-of-Flight 3-D Imaging Pixel Structures in Standard CMOS Processes", IEEE Journal of Solid-State Circuits, IEEE Service Center, Piscataway, NJ, USA, vol. 40, No. 7, Jul. 1, 2008, pp. 1594-1602, (ISSN: 0018-9200).

UK-IPO Search Report for GB1219782.8 dated Feb. 25, 2013 (6 pages).

Chitnis, Danial et al: "A Flexible Compact Readout Circuit for SPAD Arrays," Proc. of SPIE vol. 7780, 2010 (9 pages).

Crotti, Matteo, et al: "Four Channel, 40 ps Resolution, Fully Integrated Time-to-Amplitude Converter for Time-Resolved Photon Counting," IEEE Journal of Solid-State Circuits, vol. 47, No. 3, Mar. 2012 (10 pages).

Rochas, Alexis, et al: "Actively Recharged Single Photon Counting Avalanche Photodiode Integrated in an Industrial CMOS Process," www.sciencedirect.com, Sensors and Actuators A 110 (2004) 124-129 (6 pages).

* cited by examiner

PIXEL CIRCUIT WITH CONTROLLED CAPACITOR DISCHARGE TIME OF FLIGHT MEASUREMENT

PRIORITY CLAIM

This application claims priority from Great Britain Application for Patent No. 1219782.8 filed Nov. 2, 2012, the disclosure of which is incorporated by reference.

TECHNICAL FIELD

This invention relates to pixel circuits comprising a Single Photon Avalanche Diode (SPAD) and in particular to Single Photon Avalanche Diode based time of flight pixels for time resolved imaging.

BACKGROUND

A SPAD is based on a p-n junction device biased beyond its breakdown region. The high reverse bias voltage generates a sufficient magnitude of electric field such that a single charge carrier introduced into the depletion layer of the device can cause a self-sustaining avalanche via impact ionization. The avalanche is quenched, either actively or passively, to allow the device to be "reset" to detect further photons. The initiating charge carrier can be photo-electrically generated by means of a single incident photon striking the high field region. It is this feature which gives rise to the name 'Single Photon Avalanche Diode'. This single photon detection mode of operation is often referred to as 'Geiger Mode'.

SPAD arrays have been used as solid-state detectors in imaging applications where high sensitivity and timing resolution are required. Current state of the art SPAD imaging arrays typically have large (>20 μm) pixel pitches. A smaller pixel pitch facilitates increased resolution for SPAD based 3D Imagers.

It is desirable to provide for smaller SPAD time of flight pixel circuits so as to be able to reduce pixel pitches in SPAD imaging arrays.

SUMMARY

In a first aspect there is provided a pixel circuit comprising: a single photon avalanche diode (SPAD); a measurement circuit comprising a capacitance; wherein said SPAD is operable to detect a photon incident on said SPAD; and said measurement circuit is operable to discharge said capacitance at a known rate over a discharge time period, the length of said discharge time period being determined by the time of said detection of said photon incident on said SPAD, such that the final amount of charge on said capacitance corresponds to the time of flight of said photon.

Correspondence here includes both "forward mode" and "reverse mode" operation.

Said pixel circuit may comprise either a static or a dynamic memory operable to disable operation of the pixel after detection of a first photon incident on said SPAD. A dynamic memory may comprise only two or three transistor devices, the storage element being provided by the inherent capacitance of at least one of the transistor devices. Said memory may be operable to selectively connect the SPAD output to the measurement circuit depending on its stored content.

Said pixel circuit may be operable in a reverse mode where it begins discharge of said capacitance on detection of a first SPAD event during a time period and prevents said discharge of said capacitance at the end of said time period. In this embodiment the charge on said capacitance is discharged via a switch controlled by the output of said SPAD.

Said pixel circuit may be operable in a forward mode where it begins discharge of said capacitance at a first known time period and prevents said discharge of said capacitance on detection of a first SPAD event. In this embodiment a time varying ramp signal may be applied, via a hold switch, to said capacitance, said capacitance sampling said ramp signal, said hold switch disconnecting said ramp signal from said capacitance on detection of said first photon incident on said SPAD.

Said pixel circuit may comprise a time gating stage operable to begin sensing operation on reception of an enable signal. Said time gate stage may comprise a switch operable to selectively connect the SPAD output to the measurement circuit on reception of said enable signal. Said time gate stage may comprise two further switches operable to disable the pixel circuit on reception of a disable signal.

In a further aspect there is provided a time resolved imaging apparatus comprising an array of pixels according to the first aspect and an illumination source for providing said radiation incident on said SPAD. Said time resolved imaging apparatus may be operable to begin sensing operation of said array of pixels simultaneously with activation of said illumination source.

In a further aspect there is provided a method of measuring the time of flight of a photon comprising: activating a radiation source to emit photons; receiving some of said photons using a single photon avalanche diode (SPAD); and discharging a capacitance at a known rate; wherein said discharging is either begun or ended upon detection of a photon received by said SPAD, such that the amount of charge remaining on said capacitance at the end of said time period corresponds to said time of flight of radiation incident on said SPAD.

BRIEF DESCRIPTION OF THE DRAWINGS

Embodiments will now be described, by way of example only, by reference to the accompanying drawings, in which.

DETAILED DESCRIPTION OF THE EMBODIMENTS

Disclosed herein are Time of Flight (ToF) analog pixels, which may be used in a large scale array for 3D single photon avalanche diode (SPAD) based imagers. The pixels designs allow for a low transistor count enabling small pixel pitches for large imagers, such as those used for 3D imaging.

The ToF structures are suitable for direct imaging and address the problem of 'once and for all' time capture operation using a dynamic memory to temporarily disable pixel operation. Direct ToF circuits are designed to capture one time measurement until a reset and read out process. Reference is made to this as 'once and for all' operation. Therefore a memory (for example SRAM or a 2T or 3T DRAM) is provided to disable the measurement circuit from processing any further incoming SPAD avalanche events.

The pixels may have a time gate to produce higher signal to noise ratio (SNR) and lower power consumption. Variations of the structures allow for positive or negative going input SPAD pulses.

The time measurement circuit operates by discharging a known capacitance over a known time. The circuit may be activated by a positive going voltage spike, as produced by the photon-induced avalanche of a positive drive (PD) P-well SPAD. PD deep N-well SPADs or negative drive (ND) P-well SPADs produce a negative going voltage spike on diode avalanche and, if these are used, an inverter should be provided to obtain a positive spike.

Figure 1:
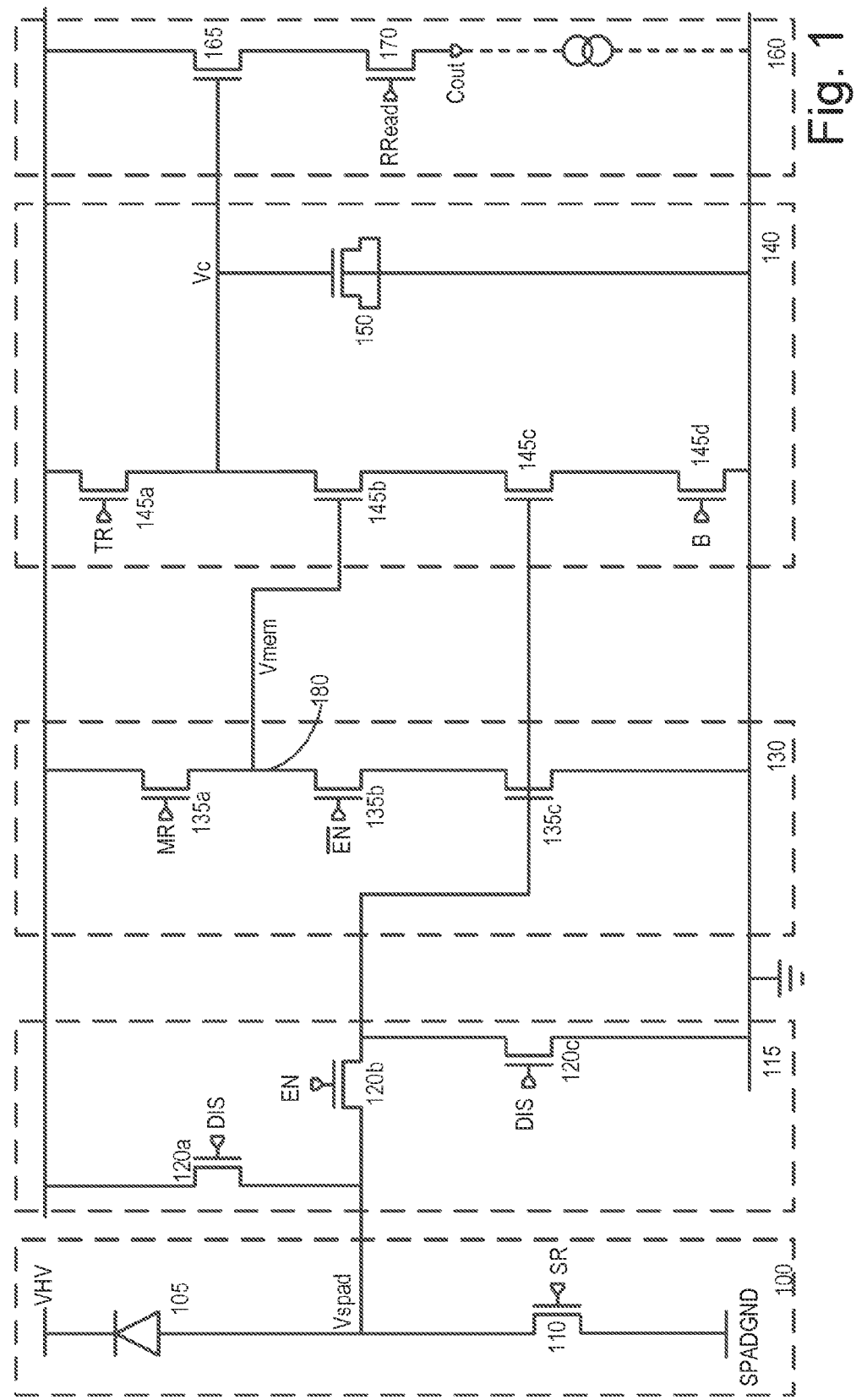
FIG. 1 is a circuit diagram of a time of flight pixel circuit according to a first embodiment.

FIG. 1 shows a Time of Flight pixel circuit according to a first embodiment. It works as an analog time to amplitude converter (TAC), and operates in a "reverse mode", that is the measured time is the time within the time frame which is not the time of flight. As the time frame is of fixed length, the time of flight is easily calculated from this.

The circuit comprises five main stages. The first stage is the sensing stage 100, which comprises a SPAD 105 and quenching/reset device 110. The quenching/reset device receives a SPAD reset signal SR which, when pulsed high or biased above ground potential, causes the avalanche to be quenched.

The second stage is a time gate stage 115. This stage comprises three MOS devices 120a, 120b, 120c arranged in series between the positive rail and ground. The signal Vspad from the output of the sensing stage 100 is received at the node between devices 120a and 120b, the time gate stage producing an output at the node between devices 120b and 120c. Devices 120a and 120c receive on their gate a disable signal DS to selectively disable the pixel. Device 120b receives on its gate an enable signal EN to begin pixel operation. The enable signal EN should be received simultaneously with the activation of a light source, thereby time gating the pixel.

The third stage is a memory stage 130. This memory stage shares some characteristics with DRAM (dynamic random access memory) cells, and in particular "capacitorless" 1T DRAM cells that store the memory bit within the parasitic capacitance of a transistor. Memory stage 130 comprises MOS devices 135a, 135b, 135c. Device 135a receives memory reset signal MR and device 135b receives a NOT enable signal $\overline{EN}$, that is the opposite signal to the enable signal EN. The output of this memory stage 130 is signal Vmem, which is received by the fourth stage.

The fourth stage is a current sinking stage 140. Current sinking stage 140 comprises MOS devices 145a, 145b, 145c 145d, and capacitor 150. Device 145a receives on its gate, an input TAC reset signal TR, which resets the time to analog converter by recharging capacitor 150. Device 145d receives a bias input B, which adjusts the rate of discharge of capacitor 150 and therefore the sensitivity of the pixel. The output of this stage is the pixel output signal Vc.

The final stage is a readout stage 160, comprising source-follower device 165 and read device 170. Read device 170 receives an input (row) read signal RRead when pixel readout is required and provides the pixel output as column out signal Cout. The operation of such readout stages are well known and will not be described further here.

Figure 2:
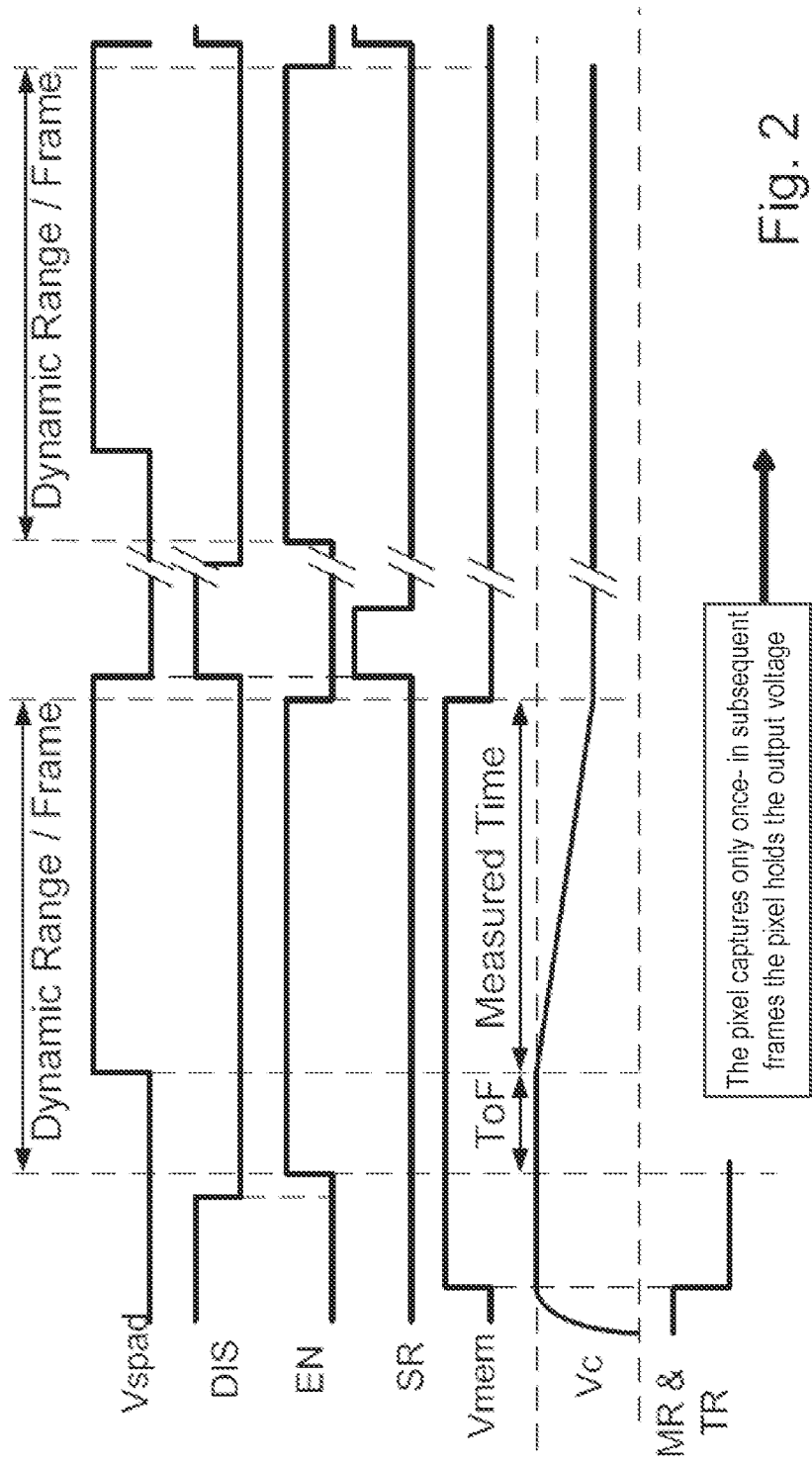
FIG. 2 is a timing diagram illustrating operation of the circuit of FIG. 1 according to an operational embodiment.

FIG. 2 is a timing diagram illustrating operation of the circuit of FIG. 1 according to an operational embodiment. It shows the signals: sensing stage output Vspad, disable signal DIS, enable signal EN, SPAD reset signal SR, memory stage output Vmem, pixel output signal Vc, memory reset signal MR and TAC reset signal TR.

With the SPAD having been reset, the signals MR and TR are pulsed. As a result, capacitor 150 is charged, causing signal Vc to increase until the capacitor 150 is fully charged. Also the capacitance on node 180 (which is the inherent capacitance of the devices on this node) is charged, setting signal Vmem high. As signal MR goes low, the charge on this node 180 is isolated, holding Vmem high and keeping device 145b switched on. Following this, disable signal DIS goes low, closely followed by enable signal EN going high in synchronization with a pulsed laser or modulated LED.

On detecting a photon from the laser or LED, the SPAD signal Vspad will go high. The time taken between EN going high and Vspad going high is the time of flight of the photon. Note that the avalanche is not immediately quenched by device 110 (signal SR stays low until the end of the frame). Signal Vspad going high causes device 145c to switch on, discharging the capacitor 150 at a rate set by the bias signal on device 145d. After a set time period, the length of which determines a time frame, signal EN goes low. This discharges node 180, causing Vmem to go low and preventing further discharge of the capacitor 150. As a result the signal Vc is held at a level directly corresponding to the length of the time frame period less the time of flight. As the time frame period length is known, the time of flight is simple to calculate.

With node 180 discharged and Vmem low, the sensing circuit 100 is effectively isolated from capacitor 150. This disables the current sinking stage 140 from processing any further incoming SPAD avalanche events, until reset via device 135a by pulsing signal MR.

Figure 3:
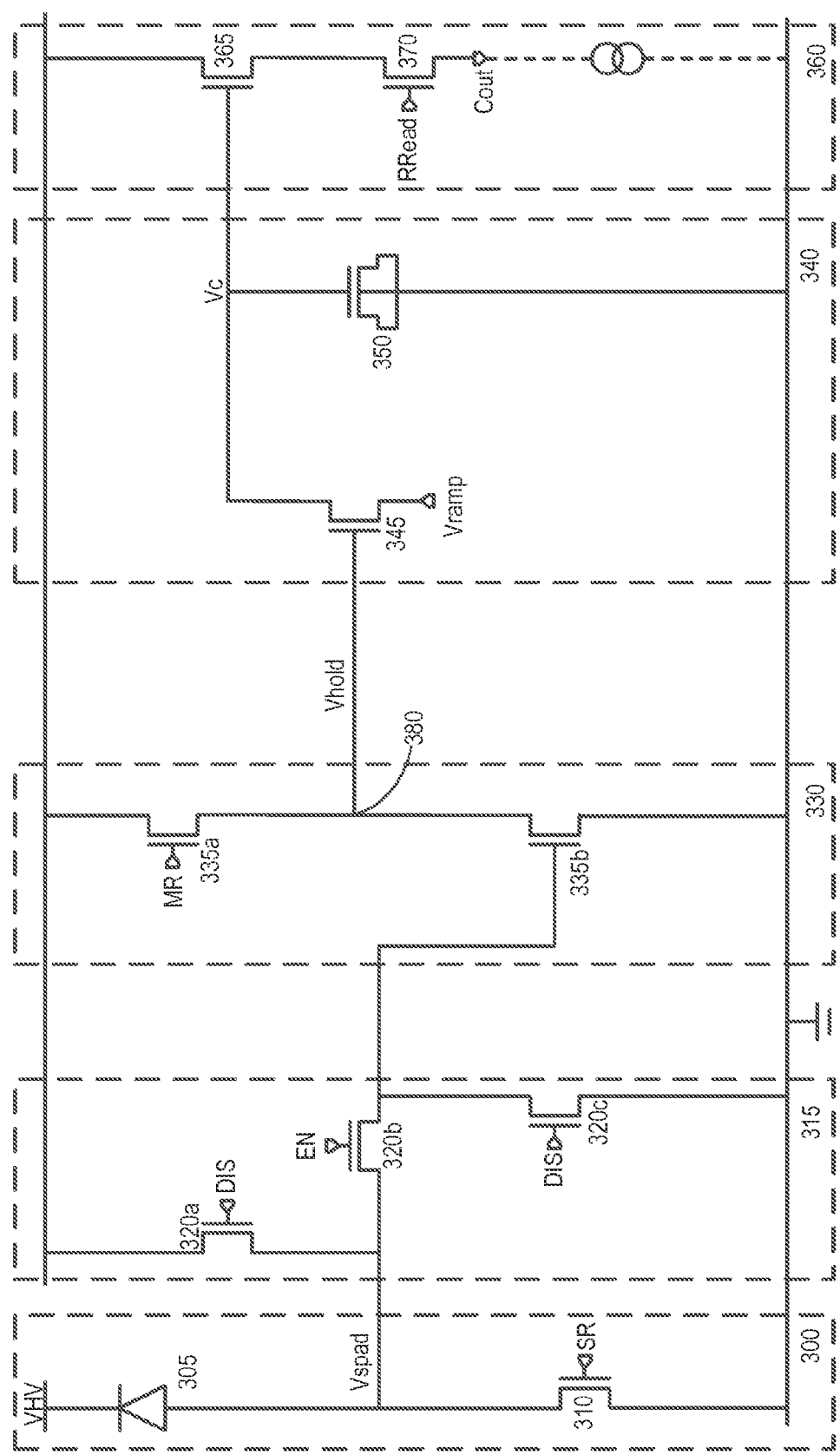
FIG. 3 is a circuit diagram of a time of flight pixel circuit according to a second embodiment.

FIG. 3 shows a Time of Flight pixel circuit according to a second embodiment. It works as a sample and hold, analog time to amplitude converter (S/H TAC), and operates in a "forward mode" where the time of flight is directly measured.

The sensing stage 300, time gate stage 315 and readout stage 360 are essentially similar to sensing stage 100, time gate stage 115 and readout stage 160 of FIG. 1. Memory stage 330 comprises MOS devices 335a and 335b, and also operates in a similar fashion to memory stage 130, in that node 380 is charged via device 335a, this charge then being isolated until discharged. However, in this arrangement it is a SPAD event which directly discharges this node 380, via device 335b. A sample and hold stage 340 is provided between the memory stage 330 and readout stage 360. The sample and hold stage 340 comprises capacitor 350, and MOS device 345. Device 345 selectively passes a ramp signal Vramp to the capacitor 350, depending on the level of signal Vhold (on node 380) on its gate.

Figure 4:
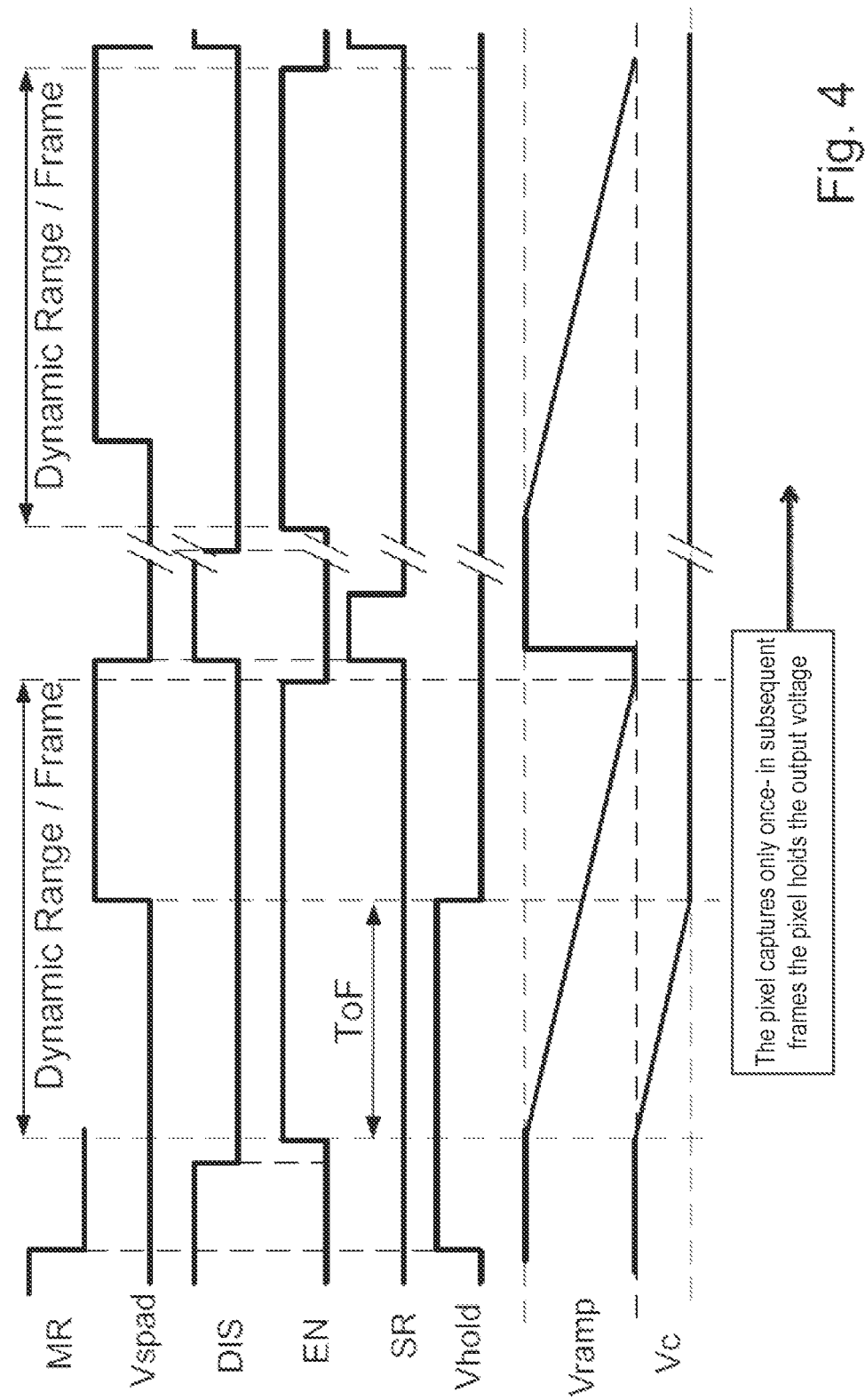
FIG. 4 is a timing diagram illustrating operation of the circuit of FIG. 3 according to an operational embodiment.

FIG. 4 is a timing diagram illustrating operation of the circuit of FIG. 3 according to an operational embodiment. It shows the signals: memory reset signal MR, sensing stage output Vspad, disable signal DIS, enable signal EN, SPAD reset signal SR, memory stage output Vhold, ramp signal Vramp and pixel output signal Vc.

With the SPAD having been reset, the signal MR is pulsed. As a result, the capacitance on node 380 (which is the inherent capacitance of the devices on this node) is charged, setting signal Vhold high. As signal MR goes low, the charge on this node 380 is isolated, holding Vhold high and keeping device 340 switched on. As a result, signal Vramp is sampled onto the capacitor 350. Disable signal DIS is then switched low. This is closely followed by enable signal EN being switched high, in synchronization with a pulsed laser or modulated LED. Signal Vramp may be a negative going periodic ramp signal synchronized to the laser/LED frequency.

On detecting a photon from the laser or LED, the SPAD signal Vspad will go high. The time taken between EN going high and Vspad going high is the time of flight of the photon.

Signal Vspad going high switches on device 335b, thereby discharging node 380, causing signal Vhold to go low. This turns off device 340, isolating the capacitor 350 from signal Vramp. The level of signal Vc when device 340 is turned off is held by capacitor 350, and corresponds directly with the time of flight of the photon.

In a similar way to that of the circuit of FIG. 1, the sample and hold circuit 340 is prevented from processing any further incoming SPAD avalanche events, until node 380 is reset high via device 335a using signal MR.

The embodiments shown above use a positive drive (PD) P-well SPAD. PD deep N-well SPADs (such as described in patent application PCT/GB2011/051686, incorporated by reference) or negative drive (ND) P-well SPADs produce a negative going voltage spike on diode avalanche. Both such SPAD designs (and others) can be used with the concepts disclosed herein.

Figure 5:
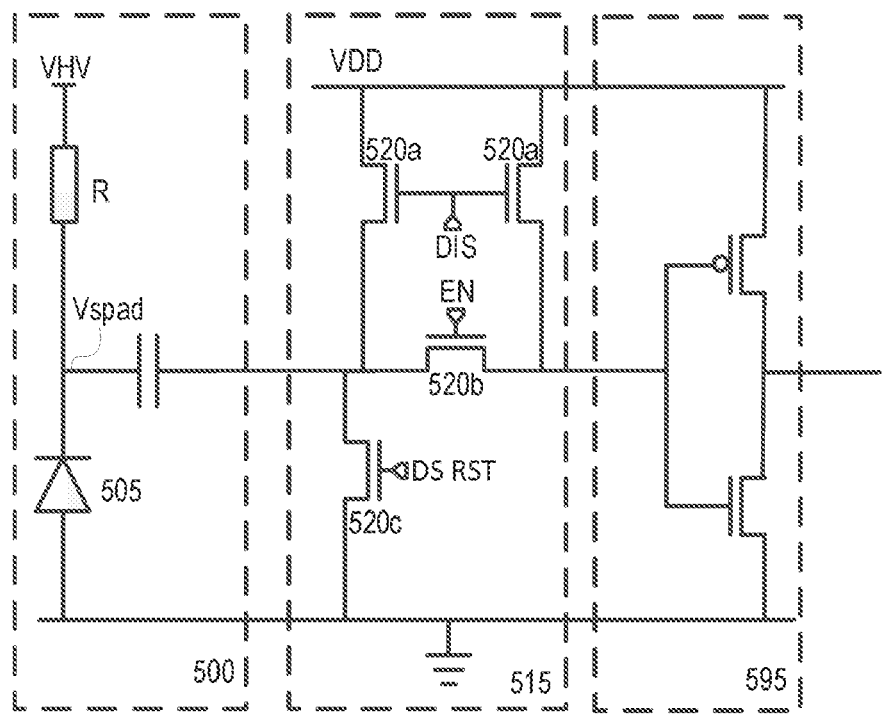
FIG. 5 is a circuit diagram of a first alternative front end for either of the time of flight pixel circuit of FIG. 1 or 3.

FIG. 5 shows a variation on the pixel circuit front end for a deep N-well SPAD. The Deep SPAD Structure uses the substrate as one half of its main p-n junction. Because of this, the anode terminal has to be common to the rest of the chip (usually ground). Therefore, the only method of connecting a bias voltage to the SPAD is to the cathode terminal, which requires a positive polarity in order to reverse bias the diode. The breakdown voltage of such a SPAD constructed from deep n-well (DNW) and the substrate will usually be relatively high because of the low doping concentrations involved. The high positive breakdown voltage of the proposed device is not compatible with standard CMOS transistor gates. Therefore, the only method of creating a high voltage compatible 'quench' resistor in CMOS is to use a highly resistive polysilicon to connect the cathode of the SPAD to a positive breakdown voltage supply. Moreover, the SPAD cathode, which is the moving node that falls in response to the avalanche current, cannot be directly connected to the CMOS inverter gates because it is also at a high DC bias level. Therefore, it is required to AC-couple the SPAD moving node to subsequent digital CMOS logic to ensure DC compatibility. To do this, the sensing circuit 700 comprises polysilicon resistor R and coupling capacitor C.

As a consequence of this, the time gate stage 515 is modified to reset the sensing circuit. The Disable signal DIS is now received by a pair of devices 520a. A reset signal DS RST is received by device 520c. Furthermore, because the SPAD 505 produces a negative spike, an inverter (in the example shown here, a push-pull inverter 595) is provided.

Figure 6:
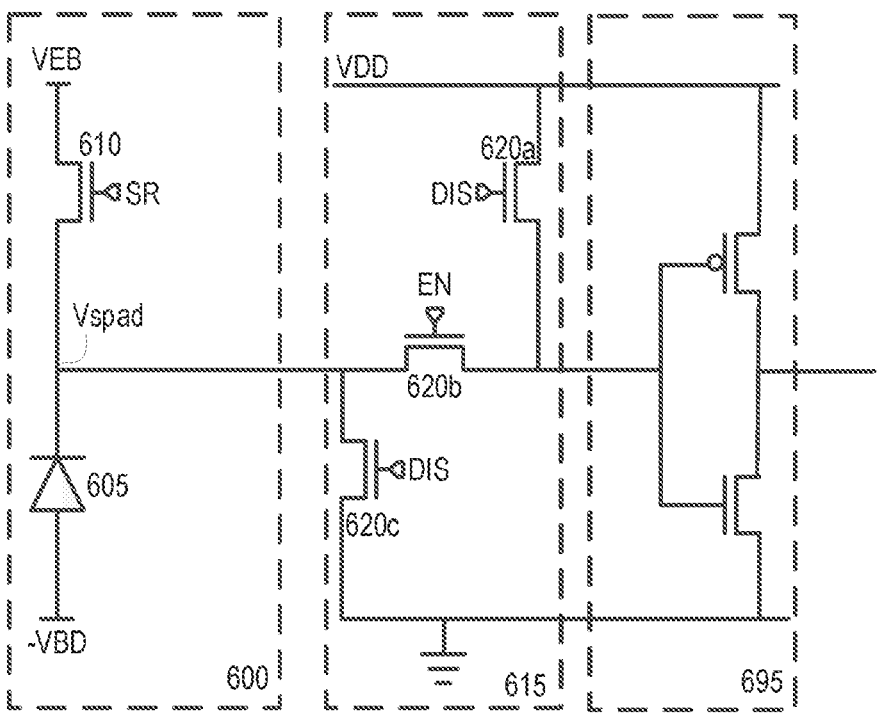
FIG. 6 is a circuit diagram of a second alternative front end for either of the time of flight pixel circuit of FIG. 1 or 3.

FIG. 6 shows a variation on the pixel circuit front end for a negative drive (ND) P-well SPAD. The sensing circuit 600 essentially mirrors that of the positive drive (PD) N-well SPAD, but connected with opposite polarity. As with the FIG. 5 example, time gate stage 615 is essentially similar to those already described, and, a push-pull inverter 695 is provided to invert the SPAD 605 output. Both front end circuits of FIGS. 5 and 6 can be used in place of sensing circuit 100, 300 and time gate circuit 115, 315 of the embodiments disclosed above.

The pixel circuits disclosed herein can be used for various ranging applications, for example. The term "ranging" is intended to cover all ranging devices and methods including by not limited to ranging devices, proximity devices, accelerometers etc. Ranging can occur in a number of applications, including proximity detection which is relative easy to implement and inexpensive; Laser ranging which is more complex and costly than a proximity detector; and three-dimensional imaging which is a high-end application that could be used to recognize gestures and facial expressions.

A proximity sensor is the most basic of the ranging applications. At its simplest the sensor is capable of indicating the presence or absence of a user or object. Additional computation and illuminator complexity can provide enhanced data such as the range to an object. A typical range is of the order 0.01 m to 0.5 m. In a simple proximity sensor the illumination source could be a modulated LED, at a wavelength of about 850 nm.

The next application group is that of laser ranging, where the illumination source is a modulated laser diode. Performance can range from <1 cm to 20 m range (and higher for top end systems) with millimetric accuracy. Requirements on optics are enhanced, with hemispherical lenses and narrow bandpass filters being required. A near-field return may result in the introduction of parallax error, i.e. movement of the returned laser spot over the sensor pixel array dependent on distance to object. To overcome these problems the ranger includes calibration functions to enable the subtraction of the electronic and optical delay through the host system. The illumination source wavelength should be visible so that the user can see what is being targeted and is typically around 635 nm.

The third application group is that of 3D cameras. In this application a pixel array is used in order to avoid mechanical scanning of the array. Systems can be based on a number of different architectures. Both time of flight (TOF) and modulated illuminator based architectures can be used, however, the latter is more robust to ambient light and thus fits best with established photodiode construction. Additional features such as face and gesture recognition are applications of this type of ranging device.

The pixel pitches of these analogue circuits are may be less than 20 μm, and may even be less than 10 μm. In fact, versions with a pixel pitch of 9.6 μm have been designed. This compares favorably with previous digital designs and existing photodiode based approaches.

Variations have been designed to allow for differing functionality, physical pixel pitches and SPAD type. Some variations are detailed herein, but further variations (e.g. different types of inverter, etc.) have not been specifically described but fall within the spirit and scope of the invention.

What is claimed is:

1. A pixel circuit, comprising:
   a single photon avalanche diode (SPAD) operable to detect a photon incident on said SPAD; and
   a measurement circuit comprising a capacitance; wherein said measurement circuit is operable to discharge said capacitance at a known rate during a discharge time period, the length of said discharge time period being determined by the time of said detection of said photon incident on said SPAD, such that a final amount of charge remaining on said capacitance corresponds to a time of flight of said photon.

2. The pixel circuit as claimed in claim 1, wherein the charge remaining on said capacitance is a direct or inverse analog representation of the time of flight of said photon.

3. The pixel circuit as claimed in claim 1, further comprising a memory element operable to disable operation of the pixel after detection of said photon.

4. The pixel circuit as claimed in claim 3, wherein said memory element comprises a storage element provided by an inherent capacitance of at least one transistor device.

5. The pixel circuit as claimed in claim 3, wherein said memory element is operable to selectively connect the SPAD output to the measurement circuit depending on its stored content.

6. The pixel circuit as claimed in claim 1, wherein detection of a photon by said SPAD defines one of the beginning or the end of said discharge time period.

7. The pixel circuit as claimed in claim 1, the SPAD and measurement circuit operable in a reverse mode wherein detection of a photon by said SPAD during a predetermined time frame begins said discharge time period, said discharge time period ending at the end of said known time frame.

8. The pixel circuit as claimed in claim 7, the SPAD and measurement circuit operable such that the charge on said capacitance is discharged via a switch controlled by the output of said SPAD.

9. The pixel circuit as claimed in claim 1, the SPAD and measurement circuit operable in a forward mode where said discharge time period begins at a first known time and ends on detection of said photon by said SPAD.

10. The pixel circuit as claimed in claim 9, further comprising a signal generator configured to generate a time varying ramp signal and a hold switch, wherein the measurement circuit is operable to apply the time varying ramp signal, via the hold switch, to said capacitance, said capacitance sampling said ramp signal, said hold switch disconnecting said ramp signal from said capacitance on detection of said first photon incident on said SPAD.

11. The pixel circuit as claimed in claim 1, further comprising a time gating stage operable to begin sensing operation on reception of an enable signal.

12. The pixel circuit as claimed in claim 11, wherein said time gating stage comprises a switch operable to selectively connect the SPAD output to the measurement circuit on reception of said enable signal.

13. The pixel circuit as claimed in claim 12, wherein said time gating stage comprises two further switches operable to disable the pixel circuit on reception of a disable signal.

14. A time resolved imaging apparatus, comprising:
an array of pixel circuits, each pixel circuit comprising:
    a single photon avalanche diode (SPAD) operable to detect a photon incident on said SPAD; and
    a measurement circuit comprising a capacitance; wherein said measurement circuit is operable to discharge said capacitance at a known rate during a discharge time period, the length of said discharge time period being determined by the time of said detection of said photon incident on said SPAD, such that a final amount of charge remaining on said capacitance corresponds to a time of flight of said photon; and
a radiation source for providing photon radiation incident on said SPAD.

15. The time resolved imaging apparatus as claimed in claim 14, said measurement circuit operable to begin sensing operation of said array of pixels simultaneously with activation of said radiation source.

16. The time resolved imaging apparatus as claimed in claim 14, being operable to perform three-dimensional imaging.

17. A method of measuring a time of flight of a photon, comprising:
activating a radiation source to emit photons;
receiving one or more of said photons using a single photon avalanche diode (SPAD); and
discharging a capacitance at a known rate;
wherein said discharging is either begun or ended upon detection of a photon received by said SPAD, such that the amount of charge remaining on said capacitance at the end of said time period corresponds to said time of flight of radiation incident on said SPAD.

18. The method as claimed in claim 17, wherein the charge remaining on said capacitance is an analog representation of the time of flight of radiation incident on said SPAD.

19. The method as claimed in claim 17, further comprising preventing detection of further photons after detection of the first photon incident on said SPAD.

20. The method as claimed in claim 17, further comprising:
defining a time frame of known length, the beginning of the time frame coinciding with the activation of the radiation source;
beginning said discharge of said capacitance upon detection of a photon during said time frame; and
preventing further discharge of said capacitance at the end of said known time frame.

21. The method as claimed in claim 20, wherein the charge on said capacitance is discharged via a switch controlled by the output of said SPAD.

22. The method as claimed in claim 17, further comprising:
beginning discharge of said capacitance at a first known time; and
preventing further discharge of said capacitance upon detection of a photon.

23. The method as claimed in claim 22, further comprising:
sampling a time varying ramp signal on said capacitance, and
disconnecting said ramp signal from said capacitance on detection of said first photon incident on said SPAD.

* * * * *